US007503422B2

(12) United States Patent
Combest et al.

(10) Patent No.: US 7,503,422 B2
(45) Date of Patent: Mar. 17, 2009

(54) EXPANDABLE SPEAKER ENCLOSURE

(75) Inventors: Christopher Combest, Leawood, KS (US); Ken Hecht, Jacksonville, FL (US)

(73) Assignee: Induction Dynamics LLC, Overland Park, KS (US)

( * ) Notice: Subject to any disclaimer, the term of this patent is extended or adjusted under 35 U.S.C. 154(b) by 157 days.

(21) Appl. No.: 11/297,222

(22) Filed: Dec. 8, 2005

(65) Prior Publication Data

US 2007/0131477 A1 Jun. 14, 2007

(51) Int. Cl.
*H05K 5/02* (2006.01)
*H04R 1/22* (2006.01)
*H04R 1/02* (2006.01)
*H05K 5/00* (2006.01)
*H04R 1/20* (2006.01)

(52) U.S. Cl. ........................ 181/150; 181/156; 381/349

(58) Field of Classification Search ................. 181/150, 181/148, 156, 199; 381/305, 334, 335, 345, 381/349

See application file for complete search history.

(56) References Cited

U.S. PATENT DOCUMENTS 2,186,276 A * 1/1940 Schwarz et al. ............. 181/150
4,161,995 A * 7/1979 Pohlmann et al. ........... 181/150
4,337,380 A * 6/1982 Tezuka et al. ............... 381/392
4,439,643 A 3/1984 Schweizer
4,889,208 A * 12/1989 Sugihara ..................... 181/148
4,903,300 A * 2/1990 Polk ........................... 381/335
4,953,655 A * 9/1990 Furukawa .................. 181/160
5,082,084 A 1/1992 Ye-Ming
5,644,109 A 7/1997 Newman
5,664,020 A 9/1997 Goldfarb et al.
6,513,624 B2 2/2003 Coffin
6,741,720 B1 * 5/2004 Myatt ......................... 381/386
2003/0123679 A1 * 7/2003 Dudleston et al. ........... 181/150
2006/0072776 A1 * 4/2006 Vishwamitra ............... 381/388

FOREIGN PATENT DOCUMENTS

JP 06233368 A * 8/1994

* cited by examiner

*Primary Examiner*—Edgardo San Martin
(74) *Attorney, Agent, or Firm*—Hovey Williams LLP

(57) ABSTRACT

An in-wall or ceiling speaker enclosure (10) having a predetermined air volume is provided, and includes a housing (22) designed to support a speaker assembly (18) between a pair of adjacent wall studs (12,14). The enclosure (10) also has an expandable air chamber (24) of predetermined volume operably coupled and in communication with housing (22). The enclosure (10) can be easily mounted within a pre-cut wall opening (32) of minimal size.

17 Claims, 2 Drawing Sheets

EXPANDABLE SPEAKER ENCLOSURE

BACKGROUND OF THE INVENTION

1. Field of the Invention

The present invention is broadly concerned with in-wall acoustic speaker enclosures allowing desired speakers to be mounted in a conventional wall between supporting studs. More particularly, the invention is concerned with such enclosures which include an air chamber of predetermined volume so that the acoustic response of the speakers can be optimized in a wall-mounted context.

2. Description of the Prior Art

Many homeowners desire to create elaborate entertainment centers including advanced stereo equipment and speakers. Traditional floor or wall-mounted speakers can be used in such situations, but many times a more tailored and finished appearance is desired. Therefore, it has been known in the past to mount speakers within walls or ceilings, between adjacent studs. Simple mounting hardware has been provided for these installations, typically nothing more than metallic mounting frame units.

High-end speakers are designed to operate with appropriate air volumes, and do not deliver the highest quality sound without sufficient air volume. As can be appreciated, with prior in-wall mounted speakers, the extent of air volume available may be too large or unknown. For example, a given wall may contain wiring, ductwork, wood framing, or other utility components, and exterior walls may contain insulation. Therefore, with the prior in-wall speaker mounts, an important facet of stereo design becomes a matter of chance.

A variety of speaker enclosures have been provided in the past, both for in-wall mounting and in other contexts. For example, U.S. Pat. No. 5,664,020 describes a compact loudspeaker system including an expandable cylindrical enclosure housing respective speakers on each end. The enclosure is telescopically shiftable to vary the acoustic volume of the system. This system is not designed for in-wall mounting and, owing to its expandable nature, would not be suited for this use. Other expandable or variable volume speaker mounting units are disclosed in U.S. Pat. Nos. 6,513,624; 5,644,109; 5,082,084; and 4,439,643. However, none of these units disclose an in-wall speaker enclosure having a predetermined, ideal air volume.

SUMMARY OF THE INVENTION

The present invention overcomes the problems outlined above and provides an in-wall speaker enclosure including a housing assembly operable to support one or more speakers and sized to fit between a pair of adjacent wall studs. The enclosure also includes an air chamber of predetermined volume operably coupled and in communication with the housing, and also sized to fit between the adjacent wall studs. Advantageously, the air chamber can be expanded behind an uncut wall to provide a larger speaker air volume without cutting a larger section of wall. The preferred enclosures of the invention allow initial mounting of the housing in a precut wall opening, followed by attachment of the air chamber, all without the need for further wall openings.

In particularly preferred forms, the overall enclosure includes a frame which is mounted within a pre-cut wall or ceiling opening and attached to adjacent studs. The speaker housing is then mounted within the frame and includes a lower aperture. The air chamber can be passed through the lower housing aperture and into depending relationship with the housing. Thus, the volume of the housing and the chamber defines a predetermined air volume for the speakers, regardless of the surrounding volume between the studs. This assures that the selected speakers can operate under optimal conditions. The present invention also provides a relatively large combined volume of the housing and the chamber that can be mounted in a wall opening of a relatively smaller size.

In preferred forms, the housing should have a width of from about 6-15 inches, so as to fit between standard 16-inch on-center studs. Similarly, the housing should have a depth or thickness of from about 1-3 inches.

DETAILED DESCRIPTION OF THE PREFERRED EMBODIMENT

Figure 1:
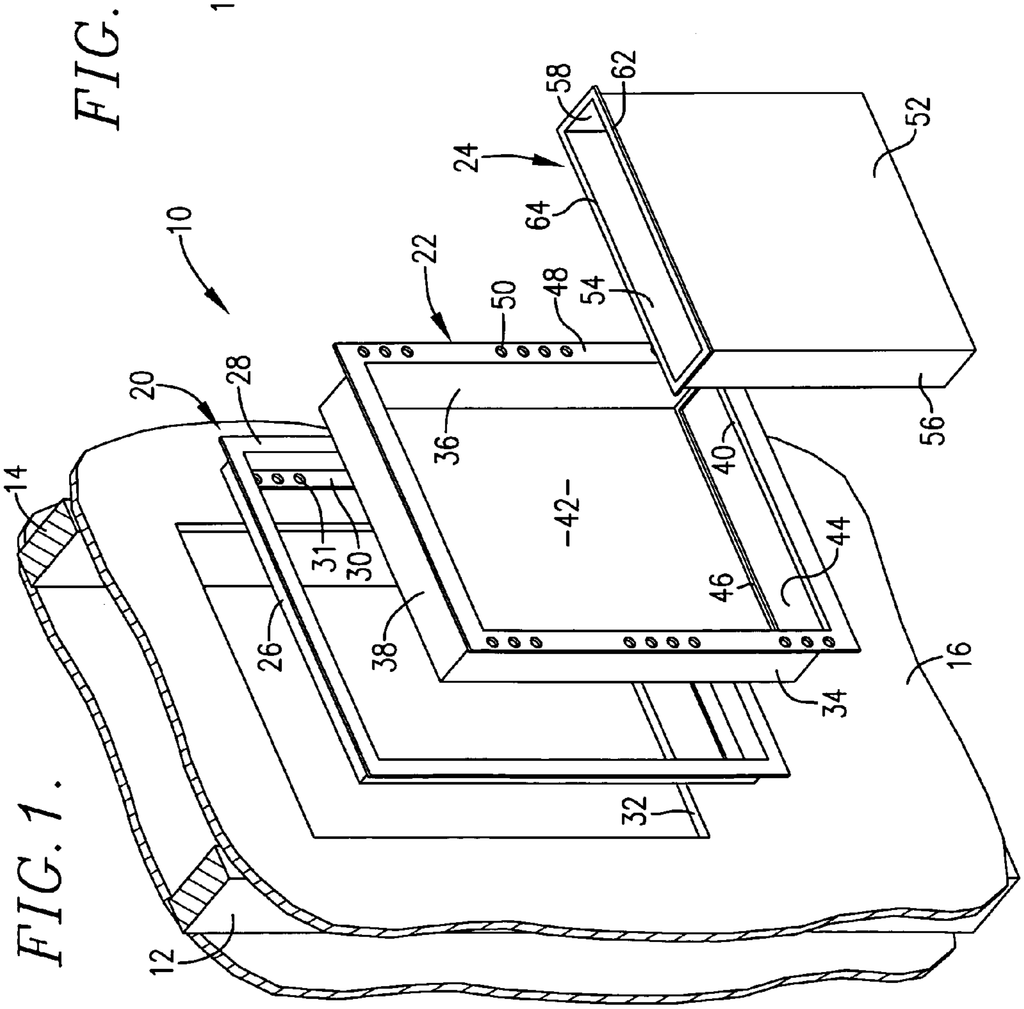
FIG. 1 is a perspective exploded view of a preferred speaker enclosure in accordance with the invention.
Figure 2:
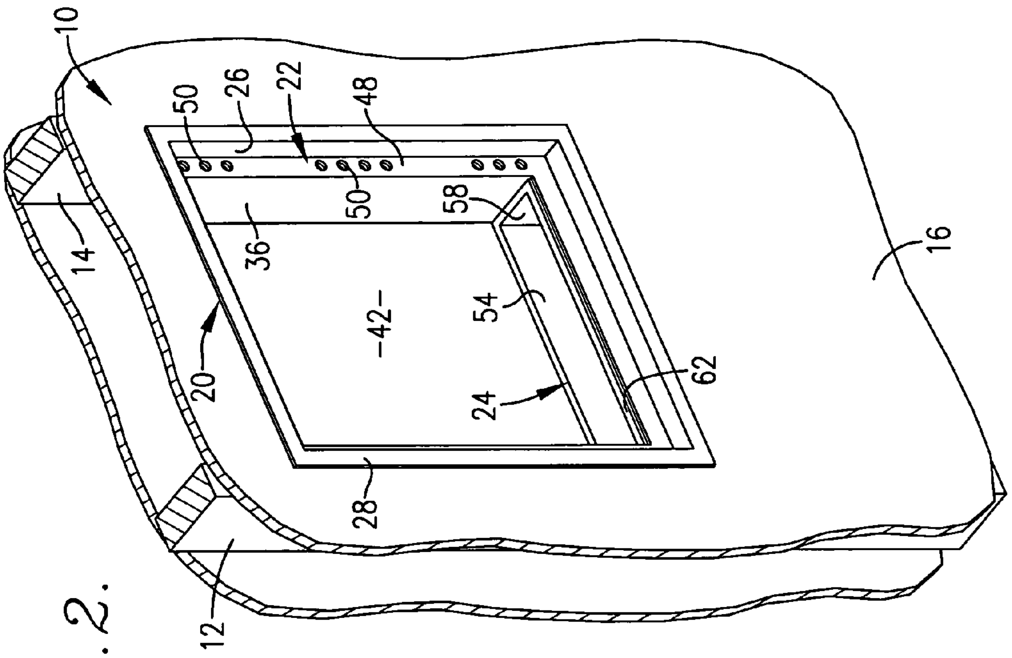
FIG. 2 is a perspective view of the speaker enclosure mounted between adjacent wall studs.

Turning now to the drawings, an in-wall speaker enclosure 10 is depicted, with reference to a conventional wall having spaced-apart, upright studs 12,14, and wall board 16 spanning the studs 12,14. The enclosure 10 is designed to fit between the studs 12,14, and support a speaker assembly 18 (see FIG. 3) in a recessed condition relative to wall board 16. The mounting also permits attachment of a conventional decorative grille (not shown) over the speaker assembly 18 to give a neat, finished appearance to the speaker unit.

In more detail, the speaker enclosure 10 is made up of three major components, namely a frame 20, housing 22, and an expandable air chamber 24. The frame and housing are of substantially quadrate configuration, and are adapted to interfit as described below. Likewise, the chamber 24 is designed for attachment to housing 22.

Specifically, the frame 20 is an integral metallic unit having a continuous peripheral primary wall 26 as well as an outermost circumscribing lip 28 and an inboard, inwardly projecting support flange 30 having mounting bores 31. The flange is designed to fit within an opening 32 (seen in FIG. 1) through wall board 16 between the studs 12,14. In particular, the frame fits within the opening 32 with primary wall 26 engaging the side margin of the opening 32 and adjacent portions of the studs 12,14; the lip 28 overlies and engages the outer face of wall board 16. The frame 20 may be secured in place by clamps behind the dry wall and the housing and/or by appropriate threaded fasteners (not shown) extending through primary wall 26 and into the studs 12,14.

The housing 22 is also of integral metallic construction and includes a pair of spaced sidewalls 34,36, top wall 38, bottom wall 40 and back wall 42. As best seen in FIG. 1, the bottom wall 40 presents an elongated, rectangular slot-like aperture 44 which is bounded by a short lip 46. Finally, the housing has a peripheral flange 48 having bores 50 which mate with the bores 31 of support flange 30. As illustrated, the housing 22 is designed to fit within frame 20, with flange 48 abutting support flange 30. Note that the flange 48 is recessed relative to the outer surface of wall board 16.

The air chamber 24 is of open-top, hollow design and includes front and rear walls 52,54, sidewalls 56,58, bottom wall 60 and an uppermost circumscribing lip 62 surrounding and defining an upper opening 64. The chamber 24 is mounted to housing 22 simply by passing the chamber downwardly through aperture 44 until the lips 46 and 62 interengage. In this fashion, the chamber 24 depends from housing 22 with the hollow interior of the chamber in communication with the interior of housing 22. Importantly, the air chamber extends from the housing to increase the overall air volume of the enclosure without requiring the opening 32 to be enlarged to accommodate the full expanded length of the housing and air chamber.

Figure 3:
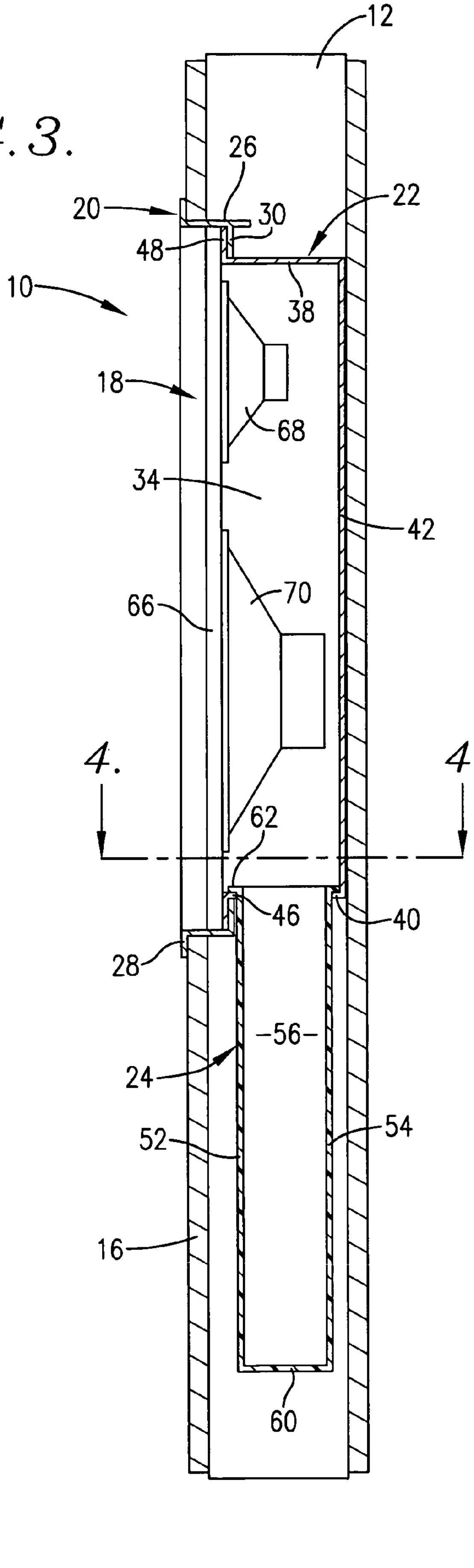
FIG. 3 is a vertical sectional view of the speaker enclosure depicted in FIG. 2 showing the air chamber expanded relative to the housing.
Figure 4:
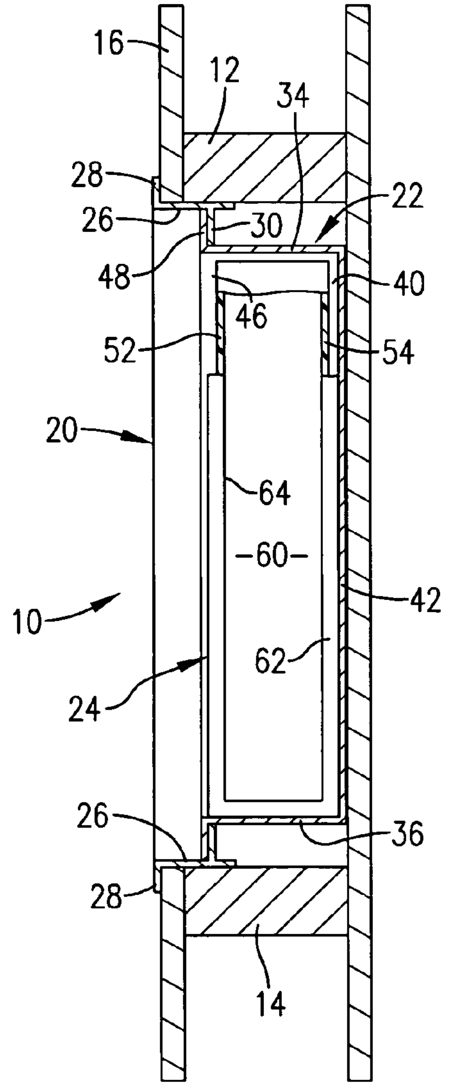
FIG. 4 is a sectional view taken along line 4-4 of FIG. 3 illustrating the construction of the enclosure.

A speaker assembly 18 is next secured to the enclosure 10. Referring to FIG. 3, a representative assembly 18 includes a baffle 66 with one or more acoustic speakers 68,70 mounted on the baffle 66. The assembly 18 is secured in place by appropriate threaded fasteners (not shown) which extend through the margin of the baffle 66 and into selected ones of the mated bores 50,31. This ensures that the assembly 18 is securely mounted to the enclosure 16. Again referring to FIG. 3, it will be seen that the assembly 18 is recessed relative to the outer surface of wall board 16. Accordingly, a conventional grille may be removably secured in place over the assembly 18 such that the grille is essentially flush with wall board 16. This gives the entire assembly a neat and finished appearance.

The volume of the hollow interior of the air chamber 24 and the volume of the interior of housing 22 is sized in accordance with the operating characteristics of the speaker assembly 18. In one embodiment, the air chamber has an interior volume of approximately 0.2 cubic feet and the housing has an interior volume of approximately 0.45 cubic feet for a total volume of 0.65 cubic feet; however, the invention is not limited to these dimensions.

It will be appreciated that a number of variations can be made in the enclosure 10 without departing from the spirit and scope of the invention. For example, the frame and housing need to be quadrate, but could be circular or of any other appropriate shape. Similarly, the size and shape of the chamber 24 can be varied to suit the needs of the user and the acoustic requirements of the speaker(s) to be employed. Also, an upper and lower chamber could also be used if desired. Finally, the frame 20, housing 22, and air chamber 24 may be formed of any suitable materials.

The inventors hereby state their intent to rely on the Doctrine of Equivalents to determine and assess the reasonably fair scope of the present invention as pertains to any apparatus not materially departing from but outside the literal scope of the invention as set forth in the following claims.

What is claimed is:

1. An in-wall or ceiling speaker enclosure comprising:

a housing operable to support one or more speakers and sized to fit between a pair of adjacent wall studs; and an air chamber of predetermined volume operably coupled and in communication with said housing, and configured to be selectively moved relative to the housing to thereby expand a volume of air associated with the housing.

2. The enclosure of claim 1, said housing being generally quadrate in configuration.

3. The enclosure of claim 2, said housing including a pair of opposed, upright sidewalls, a top wall, and an apertured bottom wall.

4. The enclosure of claim 3, said air chamber operably coupled with said bottom wall and in communication with said housing through said bottom wall aperture.

5. The enclosure of claim 1, including a circumscribing mounting flange operable to engage the exterior surfaces of wall board supported by said studs.

6. The enclosure of claim 1, said chamber depending from said housing.

7. The enclosure of claim 1, said housing having a width of from about 6-15 inches.

8. The enclosure of claim 1, said housing having a thickness of from about 1-4 inches.

9. The combination, comprising:

a speaker enclosure including a housing operable to support one or more speakers and sized to fit between a pair of adjacent studs, and an air chamber of predetermined volume slidingly coupled with and in communication with said housing, and sized to fit between said adjacent studs, wherein said air chamber presents a cross section that is uniform in size from a point most proximate said housing to a point most distal said housing; and at least one speaker assembly mounted within said housing.

10. The combination of claim 9, said housing being generally quadrate in configuration.

11. The combination of claim 10, said housing including a pair of opposed, upright sidewalls, a top wall, and an apertured bottom wall.

12. The combination of claim 11, said air chamber operably coupled with said bottom wall and in communication with said housing through said bottom wall aperture.

13. The combination of claim 9, including a circumscribing mounting flange operable to engage the exterior surfaces of wall board supported by said studs.

14. The combination of claim 9, said chamber depending from said housing.

15. The combination of claim 9, said housing having a width of from about 6-15 inches.

16. The combination of claim 9, said housing having a thickness of from about 1-4 inches.

17. The combination of claim 9, said housing including a recessed, speaker-supporting surface, said speaker assembly adjacent said surface and recessed relative to the adjacent wall surfaces.

* * * * *